United States Patent
Yamaguchi et al.

(10) Patent No.: US 6,812,164 B2
(45) Date of Patent: Nov. 2, 2004

(54) METHOD AND APPARATUS FOR IONIZATION FILM FORMATION

(75) Inventors: Hirohito Yamaguchi, Kanagawa (JP); Masahiro Kanai, Tokyo (JP); Atsushi Koike, Kanagawa (JP); Katsunori Oya, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 10/350,019

(22) Filed: Jan. 24, 2003

(65) Prior Publication Data

US 2003/0143868 A1 Jul. 31, 2003

(30) Foreign Application Priority Data

Jan. 28, 2002 (JP) ......................................... 2002-018721

(51) Int. Cl.⁷ ........................ H01L 21/31; H01L 21/469
(52) U.S. Cl. ...................... 438/788; 438/789; 438/790; 438/792; 438/793
(58) Field of Search ................... 118/723; 204/298.04, 204/298.05

(56) References Cited

U.S. PATENT DOCUMENTS

| | | | |
|---|---|---|---|
| 5,192,717 A | | 3/1993 | Kawakami et al. ......... 439/233 |
| 5,378,285 A | * | 1/1995 | Mitani et al. ............... 118/723 |
| 5,525,158 A | * | 6/1996 | Tsukazaki et al. .......... 118/723 |
| 6,027,825 A | | 2/2000 | Shiratori et al. ............ 428/694 |
| 6,113,732 A | | 9/2000 | Yoshida et al. ............. 156/345 |
| 2002/0090815 A1 | | 7/2002 | Koike et al. ................ 438/680 |

FOREIGN PATENT DOCUMENTS

| | | |
|---|---|---|
| EP | 1 113 088 | 7/2001 |
| JP | 6-290496 | 10/1994 |
| JP | 10-130832 | 5/1998 |
| JP | 2001-152330 | 6/2001 |

* cited by examiner

*Primary Examiner*—David Nelms
*Assistant Examiner*—Renee R. Berry
(74) *Attorney, Agent, or Firm*—Fitzpatrick, Cella, Harper & Scinto

(57) ABSTRACT

A method for ionization film formation to form a deposited film by ionizing vaporized particles with an ionization mechanism of the hot-cathode system and injecting the ionized particles into a substrate is provided. The method includes the step of introducing He gas inside the ionization mechanism.

10 Claims, 5 Drawing Sheets

BOTTOM COVERAGE RATIO = $T_B/T_A \times 100$ (%)

5

BOTTOM COVERAGE RATIO = $T_B/T_A \times 100$ (%)

METHOD AND APPARATUS FOR IONIZATION FILM FORMATION

BACKGROUND OF THE INVENTION

1. Field of the Invention

The present invention relates to a method for ionization film formation and an ionization film-formation apparatus used in manufacture of semiconductor devices, such as LSIs, recording media, such as magneto-optical disks, and the like.

2. Description of the Related Art

Various methods for film formation have been used in formation of wirings and formation of interlayer insulation films regarding various semiconductor devices and, furthermore, in formation of magnetic layers, protection layers, etc., regarding recording media. In this case, film-formation apparatuses are required to perform in various ways. Recently, improvement of a coverage property has been required on the inner surfaces of holes arranged in substrates, especially the bottom portions.

FIG. 6 shows the shape of a film deposited by a conventional sputtering method. The thickness of films 102 deposited on the groove bottom portions 104 of a substrate 8 are very small compared with the thickness of films 100 deposited on groove top portions 103, and, therefore, it is clear that the coverage is poor. It is seen that films are also deposited on the groove side surfaces 101. Degradation of the coverage property and adherence of the films onto the side surfaces adversely affects the quality of the film formation.

As an example, a magneto-optical disk of the domain wall displacement type disclosed in Japanese Patent Laid-Open No. 6-290496 will be described.

Regarding conventional magneto-optical disks and compact disks, grooves have been arranged concentrically on the disks, and the groove portions have not been used for recording information. However, regarding optical disks of the domain wall displacement type, functional films must be formed on the bottom portions of the grooves similar to flat portions (lands) other than the grooves in order to allow the bottom portions to become recording portions. Furthermore, to prevent interference between the grooves and the lands, magneto-optical signals must not be generated from the groove side surfaces, which are boundary surfaces, and the quantity of film adherence onto the groove side wall surfaces must be minimized. That is, regarding the magneto-optical disk of the domain wall displacement type, film formation with strong directivity and a high bottom coverage ratio (ratio of the film formation velocity onto the groove bottom surface to the film formation velocity onto the periphery surface of the groove) is required.

Conventionally, as a means of film formation with a high bottom coverage ratio, a low-pressure remote sputtering method disclosed in Japanese Patent Laid-Open No. 10-130832, etc., is known. The low-pressure remote sputtering method refers to a means in which sputtered particles do not scatter, but fly straight ahead because the pressure in a chamber is lowered compared with the pressure in a common sputtering method in order to increase a mean free path, and, in addition, the sputtered particles flying perpendicularly toward a substrate are allowed to deposit selectively on the substrate by increasing the distance between a target and the substrate.

Another method, a collimated sputtering method is known. In this method, a cylindrical tube (collimator) having a plurality of holes in the direction perpendicular to a substrate is arranged between a target and the substrate. Only particles flying perpendicularly toward the substrate are allowed to reach the substrate to form a film.

There is also a method for ionization film formation described in Japanese Patent Laid-Open No. 2001-152330, applied for a patent by the inventors of the present invention. In this method, a sputtering discharge gas is excited using an ionization mechanism of the hot cathode system, and is allowed to collide with sputtered particles to ionize the sputtered particles. The sputtered particles thereby ionized are directed perpendicular into the substrate by an electric field proximate to the substrate surface for deposition.

SUMMARY OF THE INVENTION

It is an object of the present invention to provide a method for ionization film formation and an ionization film-formation apparatus, each capable of forming a deposited film with a high bottom coverage ratio onto even a substrate having deep grooves on the surface.

It is another object of the present invention to provide a method for ionization film formation and an ionization film-formation apparatus, each having an improved ionization efficiency of vaporized particles by colliding metastable excited He atoms formed inside an ionization mechanism with the vaporized particles.

It is another object of the present invention to provide a method for ionization film formation and an ionization film-formation apparatus, each capable of preventing sputtering of a hot-cathode filament due to ions formed from an excited ionization gas by using He gas as the ionization gas, and, therefore, each is capable of improving the life of the hot-cathode filament significantly.

The aforementioned objects can be achieved by an ionization method for film formation. A deposited film is formed by ionizing vaporized particles with an ionization mechanism of the hot cathode system, and injecting the ionized particles into a substrate. The method includes the step of introducing He gas inside the ionization mechanism at the back of a hot-cathode filament, between the hot-cathode filament and a grid, or the like, when viewed from the center of an ionization space.

The aforementioned objects can be achieved by an apparatus for ionization film formation to form a deposited film by ionizing vaporized particles with an ionization mechanism of the hot cathode system, and injecting the ionized particles into a substrate. The apparatus has a gas introduction device to introduce an ionization gas inside the ionization mechanism at the back of a hot-cathode filament, between the hot-cathode filament and a grid, or the like, when viewed from the center of an ionization space.

In another aspect, the invention relates to an ionization film formation-method for forming a deposited film. The method comprises forming at least one of excited helium atoms and helium ions by causing helium gas to collide with thermoelectrons, and ionizing vaporized particles by colliding the vaporized particles with at least one of the excited helium atoms and the helium ions. Further, the invention preferably comprises forming the thermoelectrons by at least one filament of a hot-cathode system, directing the thermoelectrons from the filament to an ionization space by a positively charged grid, and either introducing the helium gas upstream of the filament, relative to the grid and the ionization space, or introducing the helium gas between the hot-cathode filament and the grid.

Further objects, features and advantages of the present invention will become apparent from the following description of the preferred embodiments with reference to the attached drawings.

DESCRIPTION OF THE PREFERRED EMBODIMENTS

The embodiments of the present invention will be described below with reference to drawings.

Figure 1:
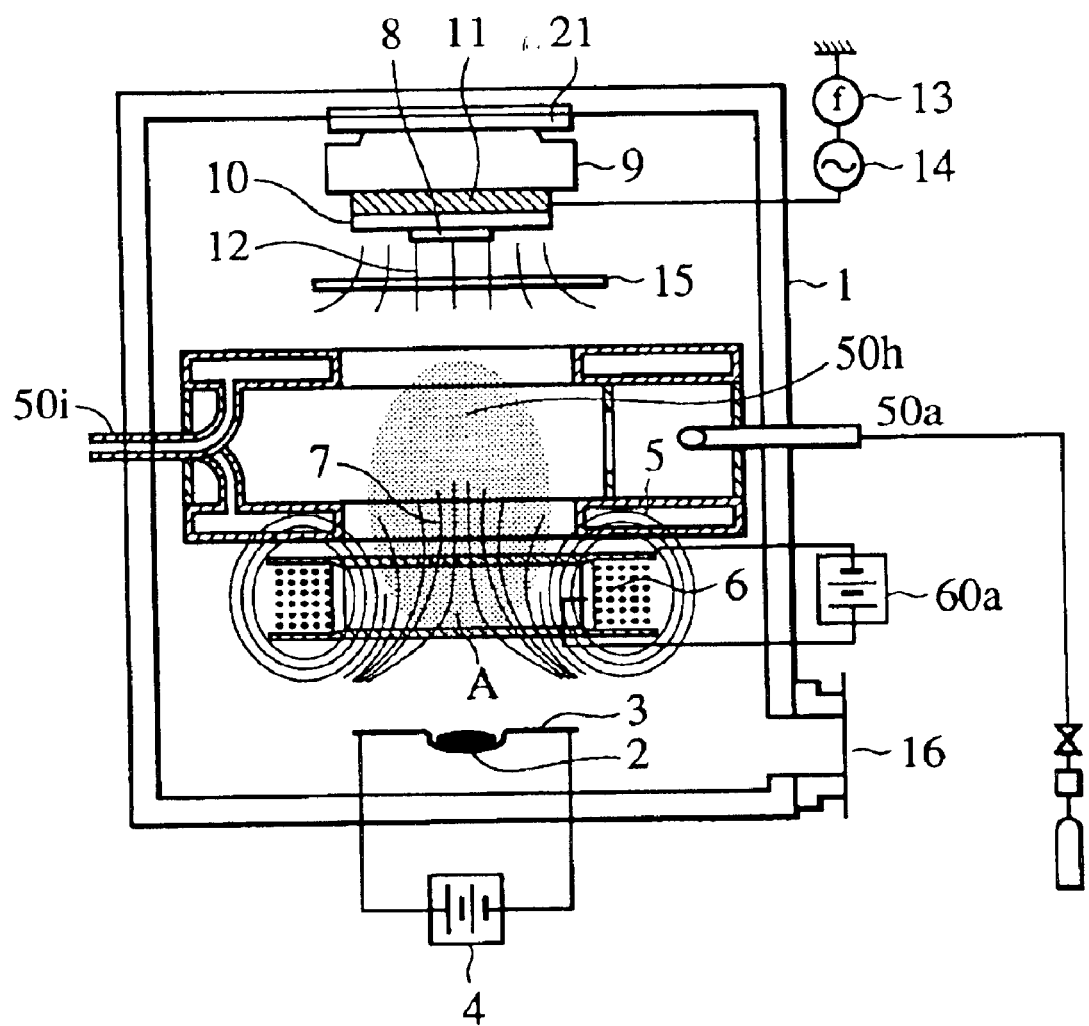
FIG. 1 is a sectional view showing the configuration of an apparatus for ionization film formation according to the present invention.

FIG. 1 is a sectional view of an apparatus for ionization film formation according to the present invention. In FIG. 1, reference numeral 5 denotes an ionization mechanism for ionizing vaporized particles, reference numeral 6 denotes a magnetic field generation device that forms a magnetic field in an ionization space, and reference numeral 11 denotes an electric field generation device that forms an electric field proximate to a substrate. A gas introduction device 50a for introducing an ionization gas is arranged at the back of a hot-cathode filament 50b, when viewed from the ionization space 50h, inside the ionization mechanism 5. The gas introduction device 50a has a structure in which a plurality of gas blow-off holes are arranged in a filament side surface at the center of a cylindrical pipe.

Regarding the mechanism of an ionization-evaporation method, particles vaporized from a crucible 3 are ionized in the ionization space 50h, and the vaporized particles thereby ionized are injected perpendicularly into the substrate surface by a negative electric field 12 on the surface of the substrate 8.

The configuration of the apparatus for ionization film formation according to the present embodiment will be described below with reference to the drawings.

A chamber 1 is a container made of a metal, for example, stainless steel and aluminum, and is electrically grounded. The airtightness is maintained by a gate valve not shown in the drawing. Although the volume of the chamber 1 varies depending on the sizes of the crucible 3 and the substrate 8, the volume of the chamber used is typically on the order of 20 L (Liters) to 1,000 L (Liters) except for specific cases. An exhaust system 16 is a combined exhaust system capable of evacuating the chamber 1 from atmospheric pressure to a pressure on the order of $1 \times 10^{-5}$ Pa. The residence time of the ionization gas in the chamber can be controlled by adjusting the exhaust velocity with a conductance valve, which is an exhaust velocity adjustor not shown in the drawing. The gas introduction device 50a is used to introduce He gas as the ionization gas, and has a structure in which a plurality of gas blow-off holes are arranged in a filament side surface at the center of a cylindrical pipe.

The crucible 3 for placing an evaporation sample 2 thereon is a hemispherical material on the order of 2 cm in diameter and 2 cm in height wound with, for example, a tungsten wire on the order of 1 mm in diameter, or a tungsten boat on the order of 0.5 mm in thickness, 1 cm in width, and 5 cm in length, and is arranged in the chamber 1 with an insulation material therebetween. An evaporation power supply 4 is used to apply predetermined electric power to the crucible 3 to heat the crucible 3 by applying direct-current or alternating-current electric power to vaporize the evaporation sample 2.

The ionization mechanism 5 is a hot-cathode system using Penning ionization, in which thermoelectrons emitted from the filament 50b collide with He gas introduced from the back of the filament to generate metastable excited He atoms and He ions. In the ionization space 50h arranged in the flying path of the vaporized particles from the crucible 3 to the substrate 8, the metastable excited He atoms and He ions collide with the vaporized particles, so that the vaporized particles are ionized.

Figure 3:
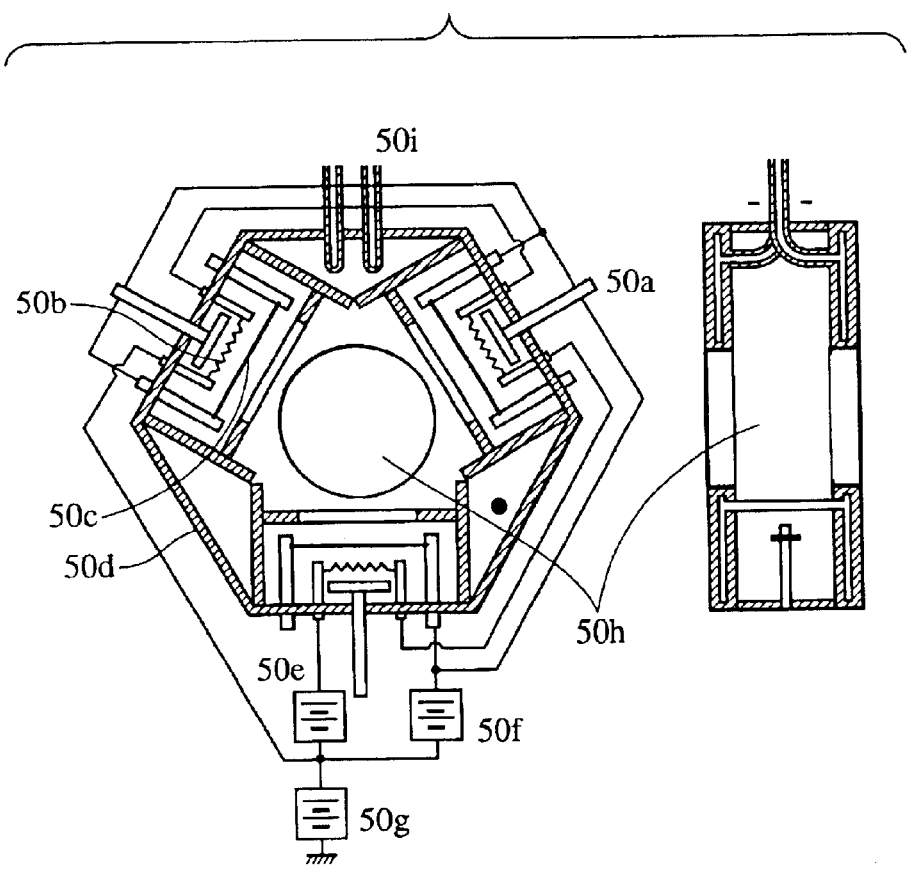
FIG. 3 is a schematic sectional view showing an example of an ionization mechanism used in the present invention.

FIG. 3 is a plan view showing the structure of the ionization mechanism 5.

Specifically, in the ionization mechanism 5, the filaments 50b connected in series are heated by the passage of a current from a direct-current power supply 50e to emit thermoelectrons. A grid 50c has a network structure. When a positive voltage is applied by a direct-current power supply 50f, the thermoelectrons emitted from the filament 50b are accelerated toward the grid 50c. The accelerated thermoelectrons collide with the He gas introduced from the back of the filament 50b, and, therefore, the metastable excited He atoms and He ions are generated inside the ionization mechanism 5 between the filament 50b and the grid 50c and in the ionization space 50h. The generated metastable excited He atoms and He ions reach the ionization space 50h, and collide with the vaporized particles to ionize the vaporized particles.

A part of the thermoelectrons emitted from the filaments 50b may pass through the grid 50c without collision with the He gas, may reach the ionization space 50h, and may collide with vaporized particles so as to ionize the vaporized particles. The thermoelectrons after completion of the aforementioned action and electrons emitted accompanying ionization of the He gas are finally captured by the grid 50c.

As the material for the filament 50b, a material, for example, ReW and W, having a large thermoelectron emission coefficient is preferred, and a grid having a network structure on the order of 1 mm in width and 3 mm in pitch is preferred as the grid 50c. One side of the filament 50b, grid 50c, and the magnetic field generation device 6 are at the same potential as that of a casing 50d. In such a configuration, an arbitrary direct-current voltage from a direct-current power supply 50g can be applied to the casing 50d. A negative direct-current voltage is applied in the present embodiment.

The introduction of the He gas and the ionization gases, which are features of the present invention, will be described.

Since generation of the metastable excited He atoms and He ions is primarily brought about proximate to the grid 50c inside the ionization mechanism 5, and, especially, between the filament 50b and the grid 50c, the introduction of the He gas is suitably arranged inside the ionization mechanism 5 at the back of the filament 50b, between the filament 50b and the grid 50c, or the like.

In general, one or more rare gases may be used as the ionization gas, for example, Ne, Ar, Kr, and Xe. However, since ions generated by collision between thermoelectrons and these gases have high sputtering yields when these ions are injected into surrounding materials, sputtering is brought about with ease. Consequently, The inside of the ionization mechanism 5 and the wall surfaces of the ionization space 50$h$ are always subjected to sputtering. As a fine wire-rod or a thin ribbon-shaped material is used for the filament 50$b$, when the filament 50$b$ is sputtered, it is consumed, and its life is reduced significantly. The sputtered materials may also reach the substrate, and be taken therein. In particular, regarding film formation of functional thin films, contamination of them may cause significant problems.

In contrast, when He is used as an ionization gas, the sputtering yield of the generated He ion is very small compared with that of the aforementioned ionic species, and sputtering of the surrounding materials due to injection of the He ions is reduced by a large degree. For example, for a tungsten filament and an ion injection energy of 400 eV, the sputtering yield of the Ar ion is on the order of 0.6, whereas, under the same conditions, the sputtering yield of the He ion is 0.05 or less. Therefore, the sputtering yield of the He ion is one-tenth or less than that of the Ar ion. Consequently, consumption of the filament due to injection of the He ion is very small, and, therefore, the life of the filament can be extended. In addition, contamination of the sputtered materials into the film can be prevented.

Another purpose of the use of the He gas as an ionization gas is to provide long-life metastable excited atoms for ionization of the vaporized particles because the lives of generated metastable excited He atoms are long. In general, most metastable excited atoms have very short lives, i.e., on the order of microseconds. However, some states of the metastable excited He atoms are very stable. For example, the lives are several thousand seconds in 1S, 2S, or 3S. The vaporized particles can be ionized efficiently by colliding these long-life, metastable excited He atoms with the vaporized atoms.

The magnetic field generation device 6 is a doughnut type electromagnet having a hollow center portion, is arranged between the crucible 3 and the ionization mechanism 5, and is fixed to the ionization mechanism 5. The vaporized particles discharged from the crucible 3 pass through the hollow center portion of the magnetic field generation device 6, reach the ionization space 50$h$, and are ionized, and deposited onto the substrate 8. Regarding the magnetic field formed by the magnetic field generation device 6, the crucible 3 side is the north pole, and the ionization mechanism 5 side is the south pole in the present embodiment, although the polarities may be reversed. In the present embodiment, the electromagnet is used as the magnetic field generation device 6. However, a permanent magnet capable of forming a magnetic field similar to that can also be used.

The function of magnetic lines of force of the magnetic field generation device 6 is to prevent that diffusion of the plasma, to maintain the plasma in the ionization space 50$h$ at a high density, and to improve the ionization efficiency. Desirably, the magnetic field generation device 6 is positioned to contact the lower portion of the ionization mechanism 5, as shown in FIG. 1, or is on the perimeter of the ionization mechanism 5. Regarding the magnetic field strength, desirably, a magnetic field having a magnetic flux density on the order of 150 to 300 G is set at the position on the ionization mechanism 5 side at a distance on the order of 30 mm from the center of the crucible 3.

A substrate holder 9 is arranged airtight in the chamber 1 with an insulation material 21 therebetween, and, preferably holds the substrate 8 parallel to the crucible 3. A lead-in electrode 11 is arranged between the substrate holder 9 and the substrate 8 via an insulation material 10, preferably parallel to the substrate 8. The lead-in electrode 11 is connected to a voltage supply composed of a signal generator (function synthesizer) 13 and a power amplifier 14. With this voltage supply, periodic rectangular wave, trapezoidal wave, sawtooth eave, etc. voltages, which have a negative polarity relative to the earth potential as the reference potential, are applied to the lead-in electrode 11.

Figure 5:
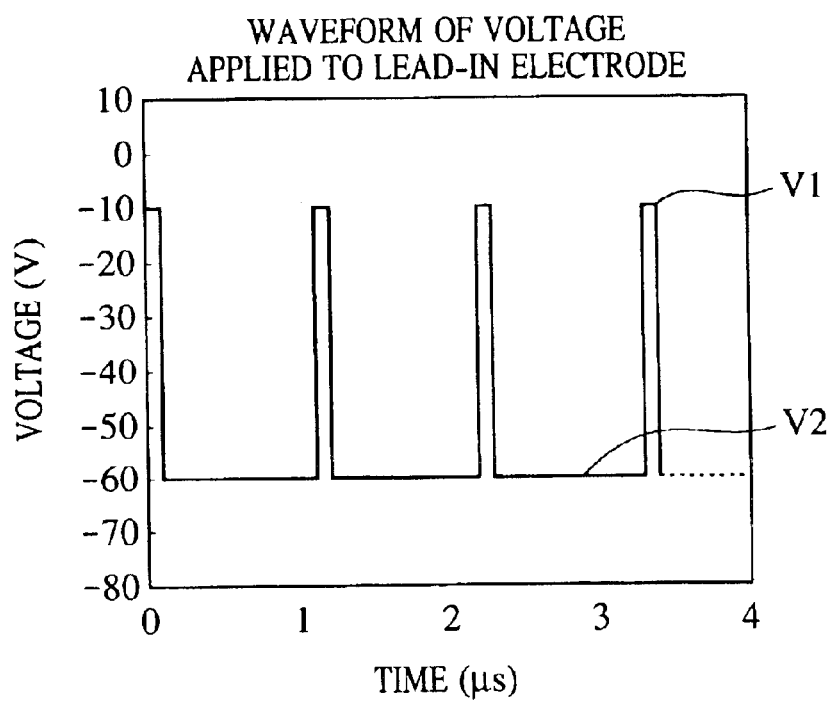
FIG. 5 is a diagram showing a waveform of a voltage applied to a lead-in electrode used in the present invention.
Figure 6:
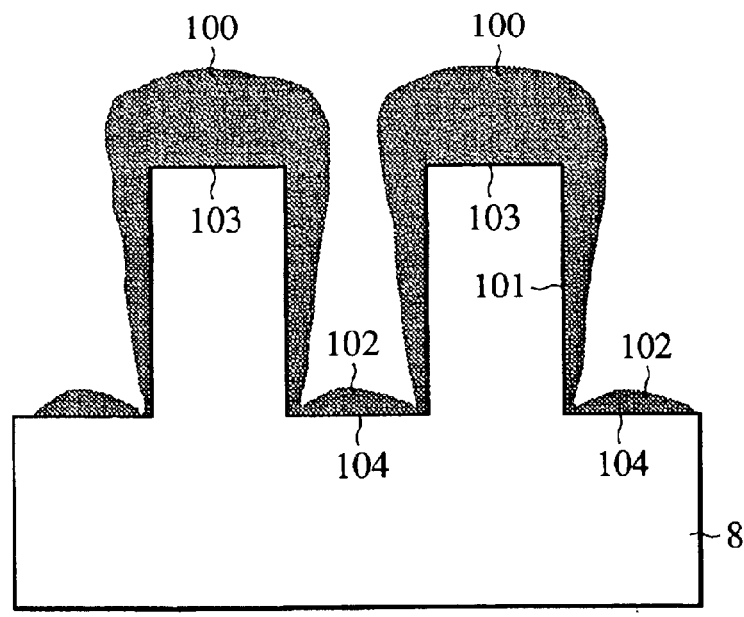
FIG. 6 is a schematic sectional view showing a shape of a deposited film by conventional sputtering.

FIG. 5 shows an example of a bias voltage applied to the lead-in electrode 11.

The bias voltage is a voltage which changes to zero or a minimum voltage (a voltage having a minimum amplitude with respect to the reference potential) V1 with negative polarity and to a maximum voltage (a voltage having a maximum amplitude with respect to the reference potential) V2 with negative polarity on a predetermined period basis. An electric field 12 is formed on the substrate surface in the direction perpendicular to the substrate 8 by this bias voltage, and vaporized particles ionized are accelerated (perpendicularly to the substrate 8) along the electric field 12 to the substrate 8. Since the electric field 12 is formed from the periodically fluctuating voltage with negative polarity, even when a dielectric substrate is used as the substrate 8, a charge-up phenomenon does not occur. The electric field 12 is formed, and, therefore, sputter particles ionized can be led into the substrate 8 perpendicularly. In the case where the substrate 8 is a conductive material, when the insulation material arranged between the substrate holder 9 and the substrate 8 is removed, and the substrate 8 is brought into contact with the lead-in electrode 11, a direct-current power supply can be used instead of the signal generator 13 and the power amplifier 14. Consequently, similar effects can be achieved by applying the direct-current voltage to the lead-in electrode 11.

Next, actions of the method for ionization film formation of the present invention will be described with reference to FIG. 1.

The substrate 8 is set on the substrate holder 9, and the inside of the chamber is evacuated to on the order of $5 \times 10^{-5}$ Pa with the combined exhaust system 16. The magnetic field generation device 6 is actuated to form the magnetic lines of force 7, and, in addition, the ionization mechanism 5 is actuated. That is, preferably, a power supply 60$a$ for an electromagnet is actuated, and the magnetic flux density at a point A between the crucible 3 and the ionization mechanism 5 is set at 150 to 300 G. In addition, a direct-current power supply 50$g$ for floating is actuated and set at an arbitrary value, the direct-current power supply 50$e$ for the filament 50$b$ is actuated so as to heat the filament 50$b$, and, therefore, thermoelectrons are emitted into the ionization space 50$h$.

The He gas is introduced with the ionization gas introduction device 50$a$, and the pressure in the chamber 1 is adjusted by controlling an exhaust velocity regulator of the combined exhaust system 16. The evaporation power supply 4 is actuated to heat the crucible 3, and, therefore, heating and vaporization of the evaporation material 2 are started. At the same time, the signal generator 13 and the power amplifier 14 are actuated to apply a voltage to the lead-in electrode 11, and, therefore, the lead-in electric field 12 is formed on the substrate surface in the direction perpendicular to the substrate 8. At this time, regarding the voltage applied to the lead-in electrode 11, the rectangular wave shown in FIG. 5, as described above, is used, for example, and at the negative minimum voltage V1 close to the reference voltage of the rectangular wave of 0 V, the electric potential is set at between the floating potential (an electric potential of a substrate generated by plasma when the substrate electrically insulated is placed in the plasma, and in the present embodiment, an electric potential generated at the substrate 8 when no voltage is applied to the lead-in electrode 11) and the plasma potential in order that electrons can be injected.

Specifically, the value of the negative minimum voltage V1 may be selected from the range of 0 V to −10 V. The negative maximum voltage V2 of the rectangular wave is preferably set at a value selected from the range of −20 V to −100 V in order that the film formation velocity is not significantly decreased because of the occurrence of a reverse sputtering effect. Preferably, in order to efficiently inject ions while preventing charge-up of the substrate, the frequency is set at 100 kHz or more, and the duty of waveform is set at 1 to 50 or more. That is, the ratio of the time of application of V1 to the time of application of V2 is preferably set at 1/50 or less.

After the aforementioned condition is maintained for several minutes until vaporization is stabilized, a substrate shutter 15 is opened, and, therefore, film formation is started. Vaporized particles are ionized in the ionization space 50$h$, fly toward the substrate 8, are accelerated by the lead-in electric field 12 on the substrate surface, are led into the substrate 8 perpendicularly, and are deposited efficiently on the bottom surface of the groove arranged on the surface of the substrate 8. After the film is formed to a predetermined thickness, the shutter 15 is closed, and the signal generator 13, power amplifier 14, evaporation power supply 4, and gas introduction device 50$a$ are stopped. Subsequently, the filament power supply 50$e$, grid power supply 50$f$, floating power supply 50$g$, and electromagnet power supply 60$a$ of the ionization mechanism 5 are stopped. Finally, the gate valve is closed, the interior of chamber 1 is returned to atmospheric pressure, and the substrate 8 is removed from the substrate holder 9.

Next, an ionization sputtering apparatus using an ionization mechanism of the hot-cathode system of the present invention will be described.

Figure 2:
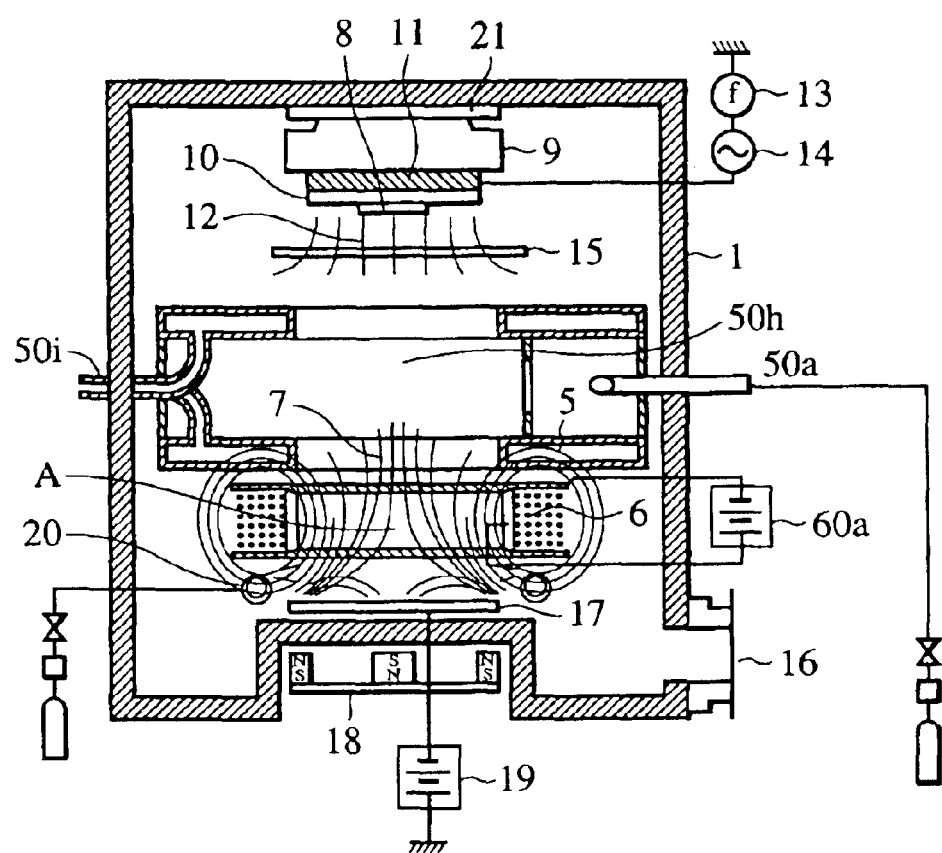
FIG. 2 is a sectional view showing the configuration of an ionization sputtering apparatus according to the present invention.

FIG. 2 is a diagram showing the ionization sputtering apparatus of the present invention.

The configuration of this apparatus is different from the configuration of the apparatus for ionization film formation shown in FIG. 1 in that a sputtering method using a target 17 as a vaporization source is adopted. Furthermore, a sputtering discharge gas introduction device 20 is arranged immediately above the target while surrounding the target. The sputtering discharge gas introduction device 20 has a structure in which a plurality of gas blow-off holes are arranged in the center side surface of the annular pipe, and is used suitably because introduction of the gas to the target surface can be performed impartially and uniformly.

The mechanism of the ionization sputtering method is similar to that of the method for ionization film formation shown in FIG. 1. Therefore, sputtered particles discharged from the target 17 are ionized with an ionization mechanism 5, and the sputtered particles thereby ionized are injected into the substrate surface perpendicularly by the negative electric field 12 on the substrate 8 surface.

Regarding the configuration of the ionization sputtering apparatus according to the present embodiment, points of difference from the configuration of the apparatus for ionization film formation in the first embodiment will be described bellow with reference to the drawings.

The exhaust system 16 is a combined exhaust system capable of evacuating the chamber 1 from atmospheric pressure to a pressure on the order of $1\times10^{-5}$ Pa. The exhaust velocity is adjusted with a conductance valve which is an exhaust velocity adjustor not shown in the drawing, and, thereby, the residence time of the gas for discharge in the chamber can be controlled.

The target 17 is in the shape of a disk on the order of, for example, 3 mm in thickness and 3 inches (76.2 mm) in diameter, and is arranged on the sputtering chamber 1 with a backing plate and an insulation material therebetween. A magnet mechanism 18 is arranged at the rear of the target 17, and, therefore, magnetron sputtering can be performed. The sputtering power supply 19 applies a predetermined electric power to the target 17, and a negative voltage of 200 to 600 (V) can be applied from a direct-current power supply or a high frequency power supply, for example, a RF power supply.

Regarding the gas introduced from the sputtering discharge gas introduction device 20 arranged immediately above the target 17, a rare gas, for example, Ar, Kr, and Xe, having a high sputtering yield when ionized is used. Most of the Ar, Kr, or Xe ionized by sputtering discharge is accelerated by an electric field arranged in the neighborhood of the target, is injected to the target, and sputter the target. A part of the rare gas ions may reach the ionization space. However, in a manner similar to that of the apparatus for ionization film formation in the first embodiment, an introduction device of an ionization gas is arranged inside the ionization mechanism 5. The inside of the ionization mechanism is filled with He gas, metastable excited He atoms, and He ions, and, therefore, the rare gas ions do not enter therein.

Consequently, sputtering of the filament 50$b$ by Ar, Kr, or Xe ions, which have a high sputtering yield, does not occur. Therefore, consumption of the filament 50$b$ can be prevented. As described above, by using separate devices as the sputtering discharge gas introduction device 20 and the ionization gas introduction device 50$a$, the life of the filament 50$b$ can be extended compared with that in the case where introduction is performed from the same position.

When the sputtering discharge gas and the ionization gas are introduced from the same position, He ions having a low sputtering yield are injected into the target 17 surface together with the sputtering discharge gas ions of Ar, Kr, or Xe, and, therefore, there is a problem in that the sputtering efficiency (vaporization velocity) of the target 17 is reduced. However, when separate introduction is performed in a manner similar to that in the aforementioned configuration, since the neighborhood of the target 17 is filled with the sputtering discharge gases, the He ions are unlikely to reach the neighborhood of the target 17, and, therefore, film formation can be performed without reduction of the sputtering efficiency (vaporization efficiency).

Figure 4:
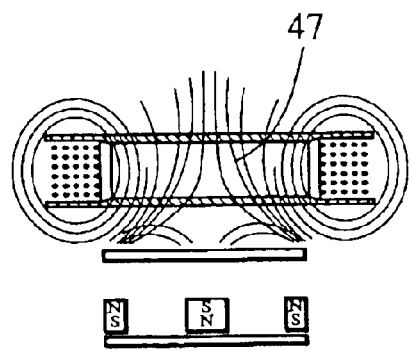
FIG. 4 is a schematic sectional view showing magnetic lines of force formed by a magnet mechanism used in the present invention.

The arrangement of the magnetic field generation device 6 is similar to that of the apparatus for ionization film formation in the first embodiment. However, the magnetic field formed by the magnetic field generation device 6 and the magnet mechanism 18 for magnetron sputtering interfere with each other, and, therefore, magnetic lines of force 47 shown in FIG. 4 are formed. The function of the magnetic lines of force 47 is to improve the sputtering efficiency by directing the sputtering discharge gas ions in the direction of the target 17, and to keep the plasma in the ionization space 50$h$ at a high density.

With respect to the polarity of the magnetic field formed by the magnetic field generation device 6 and the magnet mechanism 18 for magnetron sputtering, in the present embodiment, regarding the polarity of the magnetic field generation device 6, the target 17 side is the south pole and the ionization mechanism 5 side is the north pole, and regarding the magnet mechanism 18 for magnetron sputtering, the side of the target surface of the target center is the south pole and the side of the target surface of the target perimeter is the north pole. That is, the aforementioned effect can be achieved by allowing the magnetic field formed by the magnetic field generation device 6 and the polarity of the magnet mechanism 18 for magnetron sputtering to have the same polarity and to face each other in the target center portion.

In the present embodiment, an electromagnet is used as the magnetic field generation device 6. However, a permanent magnet capable of forming a similar magnetic field can also be used. Desirably, the arrangement and the magnetic field strength of the magnetic field generation device 6 are equivalent to those of the apparatus for ionization film formation in the first embodiment. The substrate holder 9 is desirably equivalent to that in the first embodiment.

Next, the method for ionization sputtering will be described with reference to FIG. 2. The substrate 8 is set on the substrate holder 9, and the inside of the sputtering chamber is evacuated to a pressure on the order of $5 \times 10^{-5}$ Pa with the combined exhaust system 16. The magnetic field generation device 6 is actuated to form the magnetic lines of force 7, and, in addition, the ionization mechanism 5 is actuated. That is, a power supply 60a for the electromagnet is actuated, and the magnetic flux density at a point A between the target 17 and the ionization mechanism 5 is set at 150 to 300 G. In addition, a direct-current power supply 50g for floating is actuated, and is set at an arbitrary value, the direct-current power supply 50e for the filament 50b is actuated so as to heat the filament 50b, and, therefore, thermoelectrons are emitted into the ionization space 50h.

The He gas is introduced with the ionization gas introduction device 50a, the sputtering discharge gas, for example, an argon gas, is introduced with the sputtering discharge gas introduction device 20, and the pressure in the sputtering chamber 1 is adjusted by controlling an exhaust velocity regulator of the combined exhaust system 16. The sputtering power supply 19 is actuated to create a sputtering discharge and start sputtering. At the same time, the signal generator 13 and the power amplifier 14 are actuated to apply a voltage to the lead-in electrode 11, and, therefore, the lead-in electric field 12 is formed on the substrate surface in the direction perpendicular to the substrate 8. At this time, the voltage applied to the lead-in electrode 11 is equivalent to that of the apparatus for film formation in the first embodiment.

Presputtering is performed for several minutes while the aforementioned condition is maintained, and, thereafter, a substrate shutter 15 is opened to start film formation. Particles sputtered by the sputtering discharge are ionized in the ionization space 50h, fly toward the substrate 8, are accelerated by the lead-in electric field 12 on the substrate surface, are directed into the substrate 8 perpendicularly, and are deposited efficiently on the bottom surface of the groove arranged on the substrate 8. After the film is formed to a predetermined thickness, the shutter 15 is closed, the signal generator 13, power amplifier 14, sputtering power supply 19, and gas introduction device 50a, 20 are stopped. Subsequently, the filament power supply 50e, grid power supply 50f, floating power supply 50g, and electromagnet power supply 60a of the ionization mechanism 5 are stopped. Finally, the gate valve, although not shown in the drawing, is closed, the interior of the sputtering chamber 1 is returned to atmospheric pressure, and the substrate 8 is removed from the substrate holder 9.

The examples of the present invention will be specifically described below.

EXAMPLE 1

In a manner similar to that in the aforementioned first embodiment, ionization film formation was performed continuously, and the life of the filament 50b was measured. The materials and conditions were as follows:

vaporization material: Fe distance between crucible and substrate: 155 mm substrate dimension: diameter 2 inches (50.8 mm)

substrate material: glass pressure in sputtering chamber: 0.5 Pa ionization gas: He magnetic flux density at point A: 200 G ionization mechanism grid voltage: 50 V ionization mechanism grid current: 20 A ionization mechanism floating power supply voltage: −40V lead-in electrode voltage: minimum value 0 V, maximum value −60 V lead-in electrode voltage frequency: 500 kHz lead-in electrode voltage duty: 1 to 100

The results are shown in Table 1.

COMPARATIVE EXAMPLE 1

Ionization film formation was performed continuously under the same condition as that in Example 1 except that an Ar, Kr, or Xe gas was used as the ionization gas, and the life of the filament 50b was measured.

The results are also shown in Table 1. When He is used as the ionization gas in the present Example, the life of the filament 50b is significantly extended.

EXAMPLE 2

A sample substrate having a bottom width of 0.25 μm and an aspect ratio of 4 was subjected to ionization film formation under the same conditions as that in Example 1, and, therefore, a sample was prepared.

EXAMPLE 3

A sample was formed on a sample substrate having a bottom width of 0.25 μm and an aspect ratio of 4 under the same condition as that in Example 2, except that the position of the ionization gas introduction device 50a was moved to between the filament and the grid.

COMPARATIVE EXAMPLE 2

A sample was formed on a sample substrate having a bottom width of 0.25 μm and an aspect ratio of 4 under the same condition as that in Example 2, except that the position of the ionization gas introduction device 50a was moved to the side surface portion of the crucible 3.

COMPARATIVE EXAMPLE 3

A sample was formed on a sample substrate having a bottom width of 0.25 μm and an aspect ratio of 4 under the same condition as that in Example 2, except that the position of the ionization gas introduction device 50a was moved to bring it into contact with the bottom surface of the ionization mechanism 5.

Figure 7:
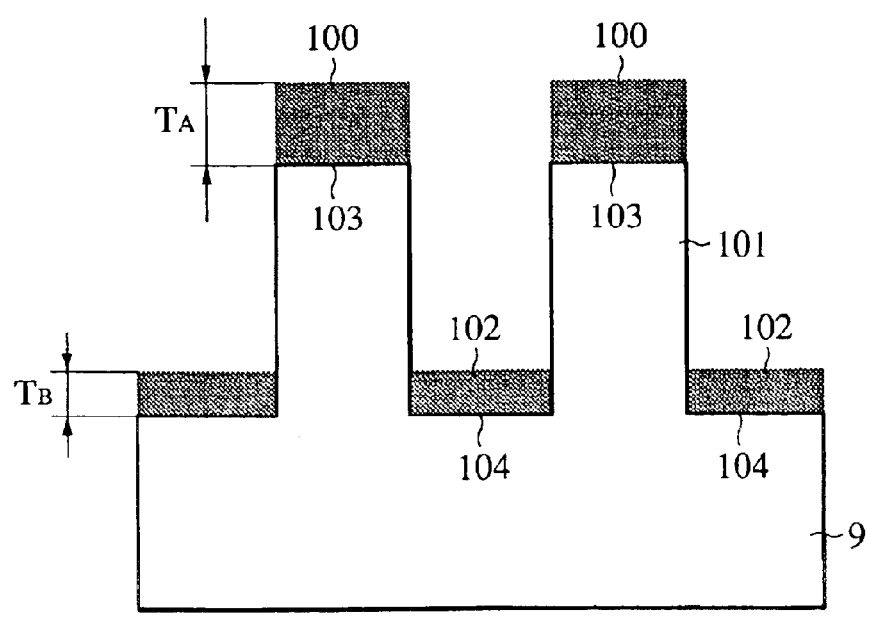
FIG. 7 is a schematic diagram illustrating a method for calculating a bottom coverage ratio.

Regarding each sample, the bottom coverage ratio was measured at the center portion of the sample substrate. FIG. 7 is a diagram showing a method for determining the bottom coverage ratio by calculation.

The results are shown in Table 2. When the position of the ionization gas introduction device 50a is inside the ionization mechanism 5, the bottom coverage ratio is improved compared with those in Comparative examples 2 and 3 in which introduction is performed from other positions. Since the bottom coverage ratio is on the order of 16% when a film is formed on a substrate having a bottom width of 0.25 μm and an aspect ratio of 4 by conventional low-pressure remote sputtering, it is clear that the film having a high bottom coverage ratio is produced when compared with that produced by low-pressure remote sputtering.

EXAMPLE 4

In a manner similar to that in the aforementioned second embodiment, ionization sputtering was performed continuously, and the life of the filament 50b was measured. The materials and conditions were as follows:

material of target 2: TbFeCo
target dimension: diameter 76.2×t 3 mm
electric power applied to target 2: 400 W
distance between target and substrate: 155 mm
substrate dimension: diameter 2 inches (50.8 mm)
substrate material: glass
pressure in sputtering chamber: 1 Pa
sputtering discharge gas: Ar
magnetic flux density at point A: 150 G
ionization gas: He
ionization mechanism grid voltage: 50 V
ionization mechanism grid current: 20 A
ionization mechanism floating power supply voltage: −40V
lead-in electrode voltage: minimum value 0 V, maximum value −60 V
lead-in electrode voltage frequency: 500 kHz
lead-in electrode voltage duty: 1 to 100

The results are shown in Table 3.

COMPARATIVE EXAMPLE 4

Ionization sputtering was performed continuously under the same condition as that in Example 4, except that no gas is introduced from the ionization gas introduction device 50a, the ionization gas He and the sputtering discharge gas Ar were mixed, and the resulting mixed gas was introduced from the sputtering discharge gas introduction device 20. The life of the filament 50b was measured.

The results are shown in Table 3. When the ionization gas and the sputtering discharge gas are separately introduced, the life of the filament 50b is significantly extended.

EXAMPLE 5

Ionization sputtering was performed for three minutes under the condition in Example 4, and a sample was prepared on a glass substrate.

COMPARATIVE EXAMPLE 5

Ionization sputtering was performed for three minutes under the condition in Comparative example 4, and a sample was prepared on a glass substrate.

Regarding each sample, the film thickness was measured at the center portion of the glass substrate, and the film formation velocity on a unit time basis was determined by calculation.

The results are shown in Table 4. When the ionization gas and the sputtering discharge gas are separately introduced, the film formation velocity is improved significantly.

EXAMPLE 6

A sample substrate having a bottom width of 0.25 μm and an aspect ratio of 4 was subjected to ionization film formation under the same conditions as that in Example 4, and a sample was prepared.

COMPARATIVE EXAMPLE 6

A sample substrate having a bottom width of 0.25 μm and an aspect ratio of 4 was subjected to ionization film formation under the same condition as that in Comparative example 4, and a sample was prepared.

Regarding each sample, the bottom coverage ratio was measured at the center portion of the sample substrate.

The results are shown in Table 5. When the ionization gas and the sputtering discharge gas are separately introduced, the bottom coverage ratio is significantly improved compared with that in the Comparative example.

TABLE 1

|  | Sort of ionization gas | | | |
|---|---|---|---|---|
|  | He | Ar | Kr | Xe |
| Filament life (Hr) | 180 | 82 | 66 | 57 |

TABLE 2

| Ionization gas introduction position | Bottom coverage ratio (%) |
|---|---|
| Back of filament | 65 |
| Between filament and grid | 64 |
| Side surface of crucible | 47 |
| Bottom surface of ionization mechanism | 49 |

TABLE 3

|  | Separate introduction | Mixed introduction |
|---|---|---|
| Filament life (Hr) | 132 | 74 |

TABLE 4

|  | Separate introduction | Mixed introduction |
|---|---|---|
| Film formation velocity (Angstrom/S) | 10.6 | 8.3 |

TABLE 5

|  | Separate introduction | Mixed introduction |
|---|---|---|
| Bottom coverage ratio (%) | 63 | 49 |

As is clear from above description, according to the present invention, film formation can be performed with an excellent bottom coverage ratio with respect to a groove having a high aspect ratio, and, in addition, the life of a hot-cathode filament can be extended significantly. Consequently, the present invention exerts a significant force on manufacture of devices, for example, next-generation DRAMs, magneto-optical disks of the domain wall displacement type, and the like.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An ionization film formation method for forming a deposited film, comprising:
    (a) forming at least one of excited helium atoms and helium ions in a first space by causing helium gas to collide with thermoelectrons; and
    (b) ionizing vaporized particles in an ionization space different from the first space by colliding the vaporized particles with at least one of the excited helium atoms and helium ions.

2. The ionization film formation method according to claim 1, further comprising forming the thermoelectrons by at least one filament of a hot-cathode system;
    directing the thermoelectrons from the filament to the ionization space by a positively charged grid; and
    introducing the helium gas upstream of the filament relative to the grid and the ionization space.

3. The ionization film formation method according to claim 1, further comprising forming thermoelectrons by at least one filament of a hot-cathode;
    directing the thermoelectrons from the filament to the ionization space by a positively charged grid; and
    introducing the helium gas between the hot-cathode filament and the grid.

4. The ionization film formation method according to claim 1, further comprising:
    generating the vaporized particles with a sputtering discharge; and
    introducing the He gas independent of the sputtering discharge.

5. The ionization film formation method according to claim 1, further comprising:
    producing a plasma with the thermoelectrons, and maintaining the plasma with a magnetic field.

6. The ionization film formation method according to claim 5, wherein the magnetic field has a magnetic flux density of from about 15 to about 300 Gauss.

7. The ionization film formation method according to claim 1, further comprising:
    forming an electric field on a surface of the substrate to accelerate the ionized vaporized particles to the substrate in a direction perpendicular to the substrate.

8. The ionization film formation method according to claim 7, further comprising forming the electric field with a periodically varying voltage.

9. The ionization film formation method according to claim 7, further comprising forming the electric field with a constant voltage.

10. The ionization film formation method according to claim 1, further comprising sputtering the film forming material to form the vaporized particles.

* * * * *